(12) United States Patent
Mukherjee

(10) Patent No.: US 7,260,674 B2
(45) Date of Patent: Aug. 21, 2007

(54) PROGRAMMABLE PARALLEL LOOKUP MEMORY

(75) Inventor: Shubhendu Mukherjee, Framingham, MA (US)

(73) Assignee: Intel Corporation, Santa Clara, CA (US)

(*) Notice: Subject to any disclaimer, the term of this patent is extended or adjusted under 35 U.S.C. 154(b) by 442 days.

(21) Appl. No.: 10/852,420

(22) Filed: May 25, 2004

(65) Prior Publication Data

US 2005/0268028 A1    Dec. 1, 2005

(51) Int. Cl.
 *G06F 12/00* (2006.01)
(52) U.S. Cl. .................................... 711/108
(58) Field of Classification Search ............. 711/108, 711/3, 117, 118, 128, 168; 365/49
 See application file for complete search history.

(56) References Cited

U.S. PATENT DOCUMENTS

| | | | | |
|---|---|---|---|---|
| 5,819,308 | A * | 10/1998 | Tien et al. | 711/108 |
| 6,374,326 | B1 * | 4/2002 | Kansal et al. | 711/108 |
| 6,538,911 | B1 * | 3/2003 | Allan et al. | 365/49 |
| 6,651,099 | B1 * | 11/2003 | Dietz et al. | 709/224 |
| 6,700,827 | B2 * | 3/2004 | Lien et al. | 365/222 |
| 6,711,040 | B2 * | 3/2004 | Chadwick et al. | 365/49 |
| 6,972,978 | B1 * | 12/2005 | Miller et al. | 365/49 |

OTHER PUBLICATIONS

Emer et al, "Asim: A Performance Model Framework", *IEEE Computer*, 35(2), pp. 68-76, Feb. 2002.

Sherwood et al, "Automatically Characterizing Large Scale Program Behavior", *10th Anniversary Int'l. Conference on Architectural Support for Programming Languages and Operating Systems (ASPLOS)*, Oct. 2002.

Hankins et al, "Scaling and Characterizing Database Workloads: Bridging the Gap Between Research and Practice", *36 Annual Int'l. Symposium on Microarchitecture (MICRO)*, pp. 151-162, Dec. 2003.

* cited by examiner

*Primary Examiner*—Hiep T. Nguyen
(74) *Attorney, Agent, or Firm*—Kenyon & Kenyon LLP

(57) ABSTRACT

A parallel lookup memory (PLM) is provided. The PLM includes a content addressable memory (CAM) array having a plurality of CAM entries. Each CAM entry has at least two storage location, and one of the locations includes value matching logic. The PLM also includes a PLM controller, which, responsive to an external command, applies a search value to a sub-set of the CAM entries. The sub-set and search values are identified by the external command, which includes data identifying CAM entries that are a start and end location of the sub-set, or data identifying a CAM entries that is a start of the sub-set and a length identifier representing a number of CAM entries to be searched. The PLM may be provided in a processor core, in a processor chip external to a processor core as a counterpart to a layer of cache, or in a multiprocessor computer system having a number of agents coupled to an external communication bus, where the PLM is provided in a first agent and a processor is provided in a second agent.

27 Claims, 5 Drawing Sheets

PROGRAMMABLE PARALLEL LOOKUP MEMORY

BACKGROUND

Embodiments of the present invention relate to content addressable memory (CAM) structures, and more particularly, to CAM structures that may be flexibly manipulated by a software program.

CAMs per se are well known. A CAM is a memory that can be accessed by its contents. The CAM typically includes various entries that store data. Each CAM entry includes value-matching logic that compares the data stored in the respective entry with an input value to determine if they are the same. When an input word is received, the input is compared bit-by-bit against each word stored in the CAM. Some CAMs require all bits of the input word to match all bits of one of the words stored in the CAM. Some require only predetermined bits to match. In any event, the comparisons performed by the various CAM entries are performed in parallel and provide very fast access to data.

Software programs, by contrast, identify operations to be performed by a microprocessor, digital controller, or the like (collectively, "processor") in sequence. Typically, content searches in software require an iterative search throughout a number of data items until a value match is detected. Various algorithms have been proposed to reduce the number of iterations that are required to perform a search. A hash algorithm, for example, might use part of an input value as a direct index to a linked list of data. But, an iterative search through the linked list ultimately is required. Consider a system that lists customer records by telephone number. A hash table might use a portion of customer numbers (e.g., the last five digits) as an index to a hash table having 10,000 entries ($10^n$, where n is the number of digits by which the hash table is indexed). Each entry in the hash table would include a pointer to a linked list of entries. Each entry in the linked list would store the remainder of the number being searched, a pointer to a next item in the linked list if the entry is not a match, and a pointer to a data record associated with the customer if the entry is a match. Continuing with the foregoing example, a ten digit phone number might require linked lists of 10,000 entries each ($10^{l-n}$, where l is the total length of the search parameter and n is the length of the hash table index). To fully search for a phone number, an iterative review of the entire linked list might be required. A software program that performs a hash table lookup might be required to search and individually examine all 10,000 entries until it found a matching entry or until it concluded that there was no match at all. Of course, this iterative search can consume a great deal of time.

Accordingly, there is need in the art for a software controlled process that provides a parallel lookup of data.

DETAILED DESCRIPTION

Embodiments of the present invention provide a parallel lookup memory (PLM) structure that can be manipulated by a software program to provide parallel hardware lookup. The hardware PLM structure may include a PLM controller and a content addressable memory (CAM) array. The CAM array may include a plurality of CAM entries, each CAM entry having a CAM portion and a pointer portion. The PLM may be mapped on to a user space(s) and written directly by write logic (not shown), which is conventional in the storage systems art. Using a software program, the CAM array may be divided into one or more "sections" to represent different structures simultaneously. A user may specify CAM entries within a section on which to perform a value match. Thus, embodiments of the present invention significantly reduce the match and scan latency of the prior art methods. At the same time, embodiments of the present invention provide a general purpose CAM structure that can flexibly manipulated using a software program to satisfy the needs of various applications.

Figure 1:
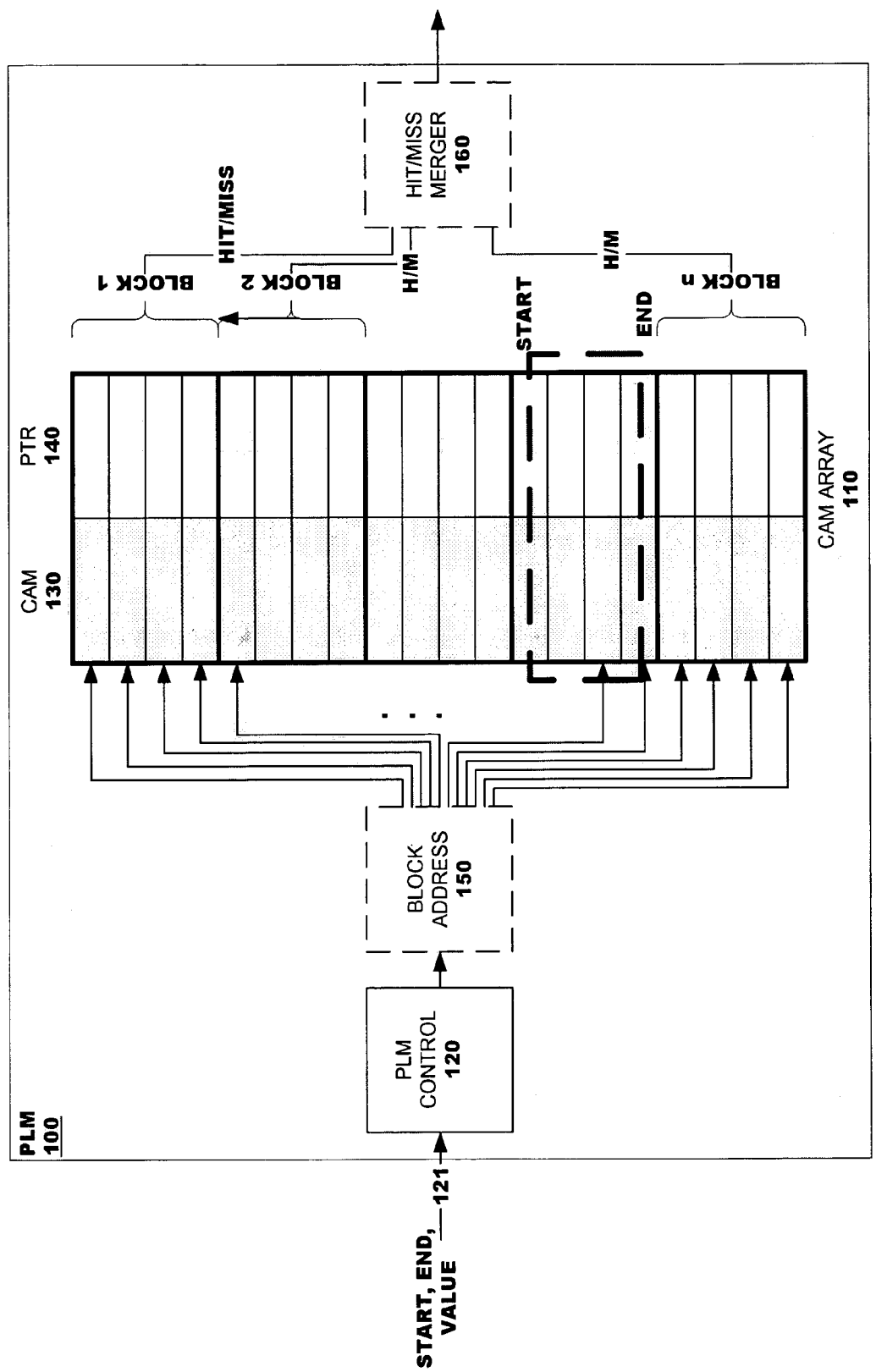
FIG. 1 illustrates a parallel lookup memory according to an embodiment of the present invention.

FIG. 1 illustrates a parallel lookup memory 100 according to one embodiment of the present invention. The PLM 100 may include a CAM array 110 and a PLM controller 120. The CAM array 110 may include a plurality of CAM entries. While only twenty CAM entries are shown in FIG. 1, the CAM array 110 may include as few or as many entries as are desired. Each CAM entry may include a CAM portion 130 and a pointer portion 140. The CAM portion 130 may store data. It may also include value-matching logic that permits a comparison to be made of data stored in the CAM entries against a lookup value on an input line 121. The value matching logic compares a lookup value to a value stored in the respective CAM entry and, if they match, a hit value may be generated on an output. The hit value may cause the pointer portion 140 to output data stored therein. The hit value may be output from the CAM array 110 to indicate that a value match occurred. The pointer portion 140 may store data representing pointers to data items stored in association with the search parameter stored in the associated CAM portion 130. According to one embodiment of the present invention, the pointer portion 140 may be a 64-bit pointer. The CAM portion 130 may also have 64 bits to match its respective pointer portion 140. As will be apparent to those skilled in the art, both the CAM portion 130 and pointer portion 140 may include as few or as many bits as are desired to accommodate the needs of a particular implementation.

The PLM controller 120 manages lookup functions of the PLM 100 in an embodiment. The PLM controller 120 may interface with external agents residing elsewhere in the processing system to receive lookup commands and manage operation of the PLM 100 to perform such commands. For example, a PLM command may identify data on which the PLM 100 is to perform the value matching and a range of PLM entries over which the value matching is to be performed. In the example illustrated in FIG. 1, the range is identified by start and end addresses of the CAM entries within the PLM 100. Alternatively, the range might be identified by a start address and a length value identifying a number of CAM entries from the start position on which the search should occur. As a further embodiment, the range might be identified using a symbolic identifier (discussed below). Responsive to the PLM command, the PLM controller 120 identifies the CAM entries on which the search is to be conducted and applies the lookup value to the specified entries.

The PLM 100, therefore, may be used as a large CAM having portions that may be allocated for a variety of purposes. A first range of CAM entries (block 1) may be allocated for a first data array and a separate second range of CAM entries (block 2) may be allocated for a second data array having a different purpose. CAM allocation may be performed and managed by software in a manner that resembles allocation and deallocation of large-scale random access memories (RAMs).

For very large PLMs (e.g., a million or more entries), the PLM 100 may be organized into blocks. The PLM 100 may also include a block address unit 150 and a hit/miss merger unit 160. The block address unit 150 may control the transmission of the input signals to different blocks of CAM entries that occur within the start and end entries. For example, the timing control unit 150 may distribute transmission of the input signal to the block(s) across multiple clock cycles to manage power consumption and/or timing issues. The hit/miss merger unit 160 may also generate an aggregate output signal therefrom.

Embodiments of the present invention, therefore, provide two instructions that can be included in an instruction set of a processor that provides a direct search capability for a PLM. When executed, the instruction would be interpreted by execution units within a processor and referred to the PLM as discussed above. Exemplary formats for an instruction may include:

OPCODE<SRegister>, <ERegister>,
OPCODE2<VRegister>, <DRegister>, where the opcode and opcode2 are a data pattern that uniquely identifies a PLM lookup operation. The SRegister identifies a register that stores the beginning of a range of CAM entries to be searched, the ERegister identifies a register that identifies the end of a range of CAM entries to be searched, the VRegister identifies a register from which the search value is to be read, and the DRegister identifies a register where data output from the PLM will be stored in the event of a hit. The PLM 100, according to one embodiment of the present invention, may have particular applications in processors or systems that have four registers, such as the x86 processors.

Thus, according to embodiments of the present invention, the PLM 100 may provide a general purpose CAM structure, which may be manipulated by a user to represent any devices or circuit elements as desired. To do so, the user, using a software program, may divide the PLM 100 into various sections using the PLM instructions. Moreover, by specifying an exact portion of the plurality of CAM entries against which to perform a value match, embodiments of the present invention may significantly reduce the match and scan latency.

Figure 2:
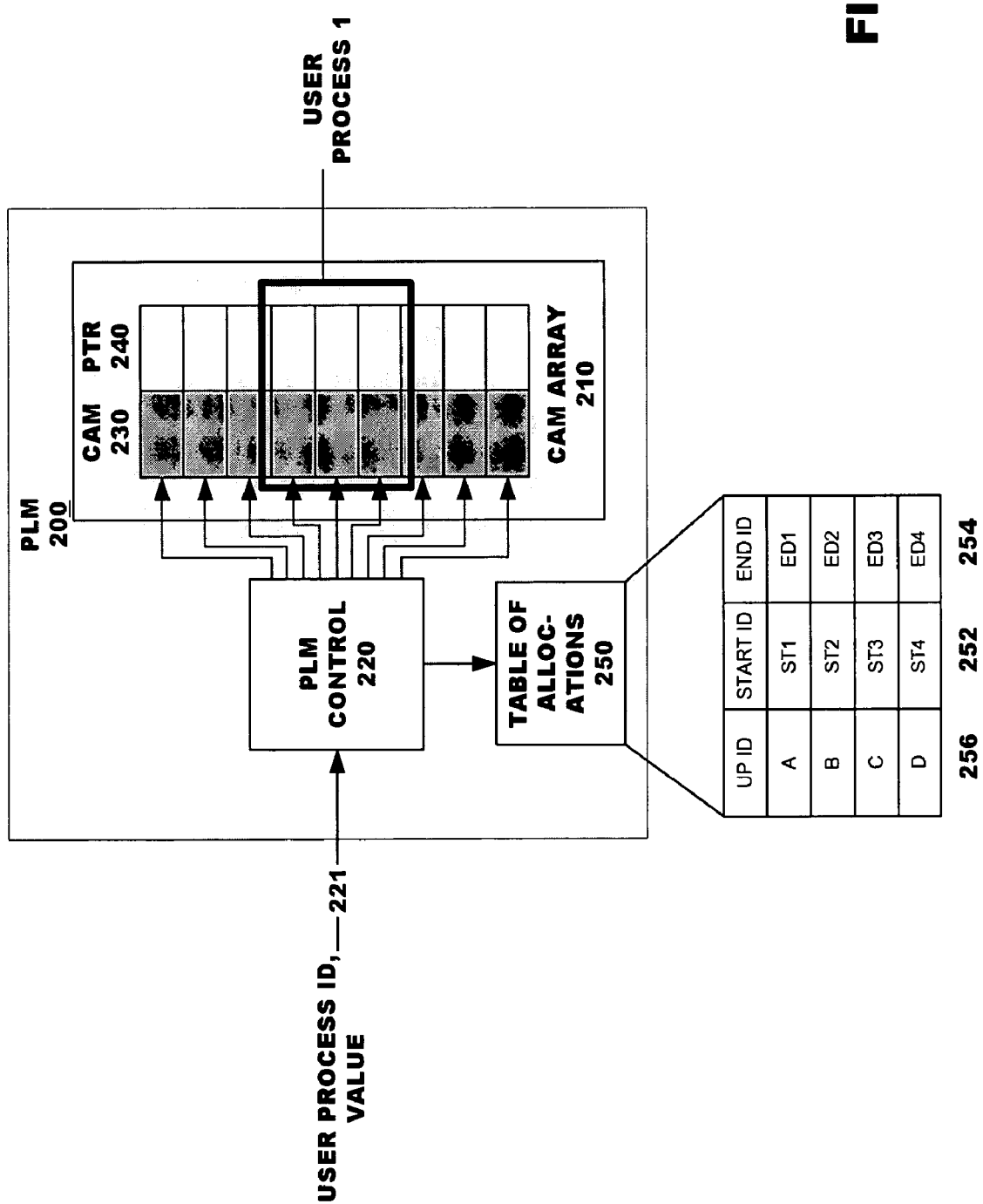
FIG. 2 illustrates a parallel lookup memory according to another embodiment of the present invention.

FIG. 2 illustrates a parallel lookup memory 200 according to a second embodiment of the present invention. The PLM 200 may include a CAM array 210 and a PLM controller 220. The CAM array 210 may include a plurality of CAM entries. Each CAM entry may include a CAM portion 230 to store data and value matching logic, and a pointer portion 240 to store pointers to return a data item that relates to data stored in the CAM portion 230.

The PLM 200 also may include an allocation table 250 that identifies portions of the CAM memory space that have been allocated for each user process. The allocation table 250, therefore, may store start ID 252, end ID 254, representing start and end locations of each allocated space. Table entries also may include a third portion 256 to store a user process ID of each allocated region. The third portions 256 may include value-matching logic to support content addressing as well.

During operation, it is sufficient to address an allocated region of the PLM by its user process ID 256 rather than an express identification of start and end locations. Responsive to a lookup command, the PLM controller may 220 compare an input identifier to user process IDs stored in the table 250. Based on a match, the PLM controller 220 may retrieve start and end locations therefrom. The PLM 200 thereafter may apply the search value to identified locations 256 of the CAM array 210.

The embodiment of FIG. 2 is particularly suited for application with processor having an instruction format of only three registers, such as the Itanium® processor, commercially available from Intel Corporation of Santa Clara, Calif. The instruction format may take the form of:

OPCODE<SRegister>, <VRegister>, <DRegister>,
where the opcode is a data pattern that uniquely identifies a PLM lookup operation, the SRegister value identifies a register storing a symbolic identifier of the PLM search range, the VRegister value identifies a register storing the search value and the DRegister value identifies a register where search results are to be stored.

The preceding discussion presents a general purpose CAM structure that can flexibly be manipulated using a software program in any way as desired by a user. The user may identify a specific portion of the memory structure on which to perform a value match. This may in turn allow the user to avoid iterative searching of matching entries and to reduce the match and scan latency.

Figure 3:
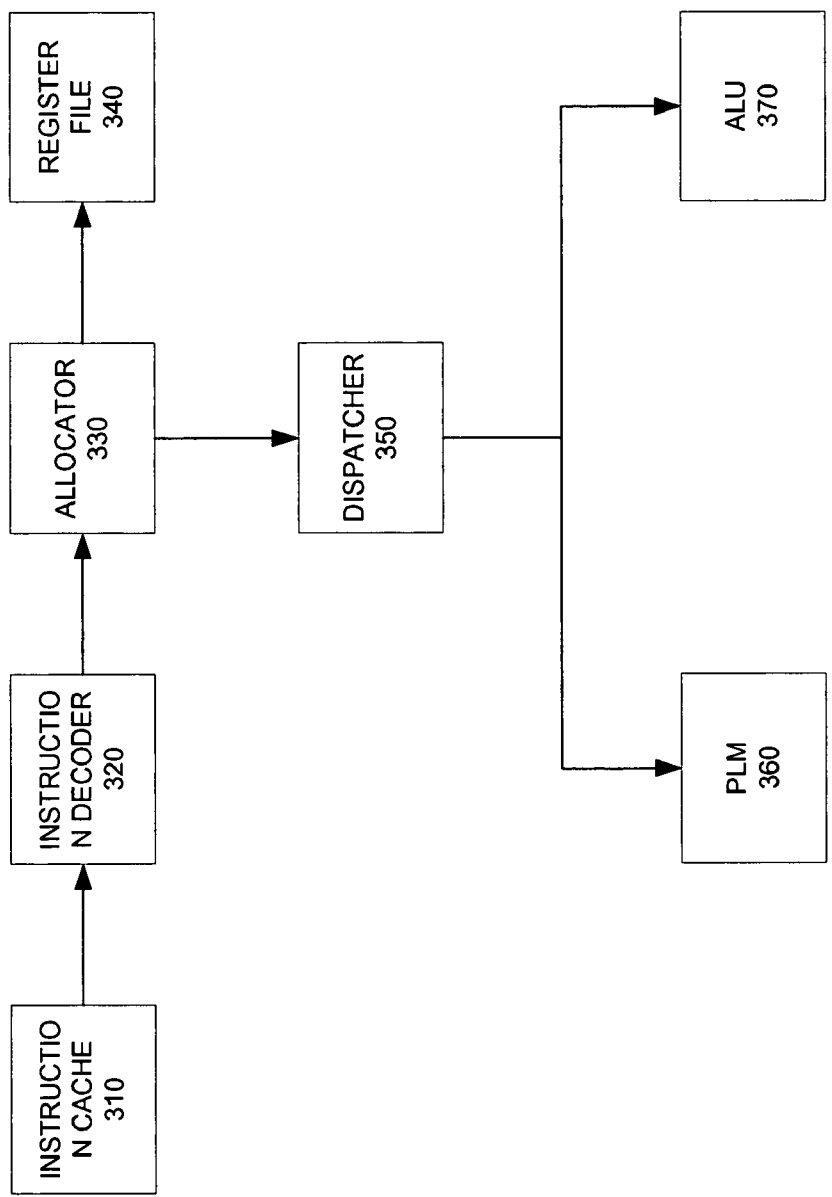
FIG. 3 is a block diagram illustrating an exemplary processor core suitable for use according to an embodiment of the present invention.

FIG. 3 is a simplified block diagram of a processor core 300 according to an embodiment of the present invention. The principles of the present invention may be applied to a processor core, one that benefits from out of order execution, for faster data access. The processor core 300 may be populated by an instruction cache 310, an instruction decoder 320, a register allocator 330, and a register file 340. The instruction cache 310 typically stores instructions to be executed by the processor core 300. The instructions are stored in the instruction cache 310 in program order even though the instructions may be executed out of order. The instruction decoder 320 may decode the instructions and determine how to execute them. The register allocator 330 may allocate registers (not shown) in the register file 340 where result data for the instructions may be stored. The register file 340 may store both source data and result data for the instructions.

The processor core 300 may also include a dispatcher 350 and various execution units. The dispatcher 350 may dispatch instructions as they become ready to be executed. The execution units may include a PLM 360, an arithmetic logic unit (ALU) 370, and the like. These execution units may execute the instructions. In operation, the allocator 330 may forward the PLM instruction to a dispatcher 350. As the PLM instruction and its associated data become readily available, the dispatcher 350 may dispatch the PLM instruction to the PLM 350. A value matching operation may be performed as instructions are performed out of order.

The dispatcher 350 may examine individual instruction and assign them to appropriate execution units based on the instruction types. The dispatcher 350 may schedule the instructions for execution and cause source data to be retrieved from identified source registers and passed to the assigned execution units. Results data is stored in assigned registers of the register file 340.

According to an embodiment the PLM 360 may be provided as an execution unit of a processor core 300. In this regard, it may receive control commands and source data under control of the dispatcher 350 and generate result data for storage in a destination register. In this regard, the PLM 350 can supplement the execution units normally found in modern processor cores.

Modern processors include multi-layer memory systems. For example, processors commonly include relatively large on-chip caches provided outside of a core system to store instructions and/or data for later use by the core. Some processors include multiple layers of cache, such as an L1 cache and a larger L2 cache, to improve processor performance. The instruction cache of FIG. 3 may be considered a lowest layer cache, called L0. Typically, the L1 cache is larger but slower than the L0 cache and the L2 cache is larger but slower than the L1 cache. Cache management processes can advantageously manage the types of data that are stored throughout this cache hierarchy to improve processor performance.

Figure 4:
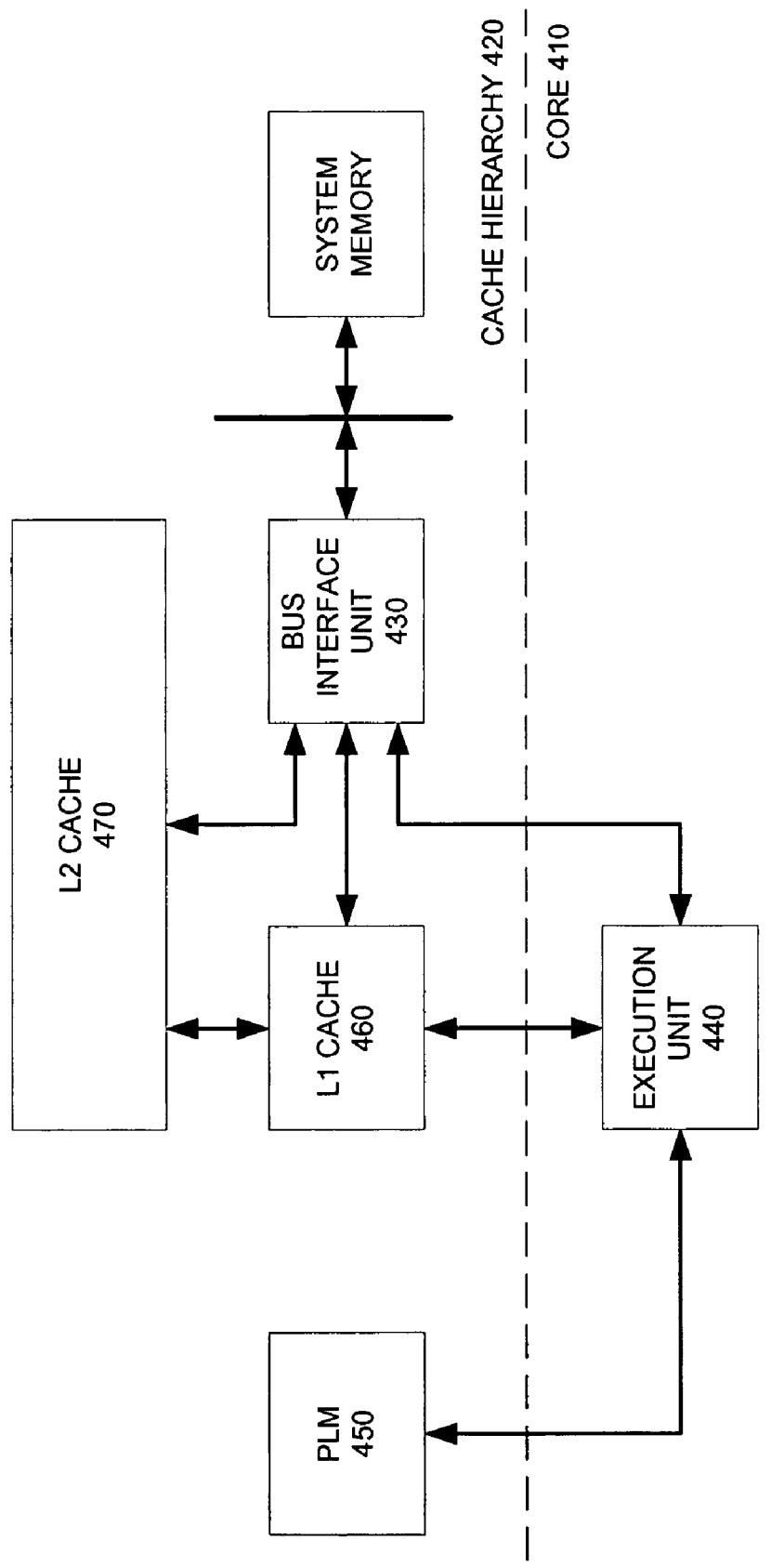
FIG. 4 is a simplified block diagram illustrating functional units within an agent of FIG. 4 suitable for use according to an embodiment of the present invention.

According to an embodiment of the present invention, PLMs of the foregoing embodiments may be provided at various levels within the cache hierarchy. The embodiment of FIG. 3 illustrates a PLM provided as an execution unit 300, which is analogous to an L0 cache. Alternatively, as shown in FIG. 4, the PLM may be provided at a level within a cache hierarchy 420 so that the PLM 400 resembles an L1 or L2 cache 460, 470, respectively. FIG. 4 illustrates an example where the PLM 400 is provided at the level of an L1 cache 460. According to these embodiments, the PLM 400 provides a CAM-based counterpart to the L1 or L2 caches.

In this embodiment, the PLM is provided with an interface to the processing core 410. The processing core 410, when it determines to search for data from the PLM 400, provides a command to the PLM 400 identifying the search value and a range of entries to be searched. The PLM 400 responds with search results identified from a hit, if one occurs. Typically, the data exchange to and from the core 410 does not expressly register within the core's register file. Instead, a load unit within the core (not shown) may manage the data exchange with the external PLM 450 and manage accesses to registers to accomplish the data transfer.

Figure 5:
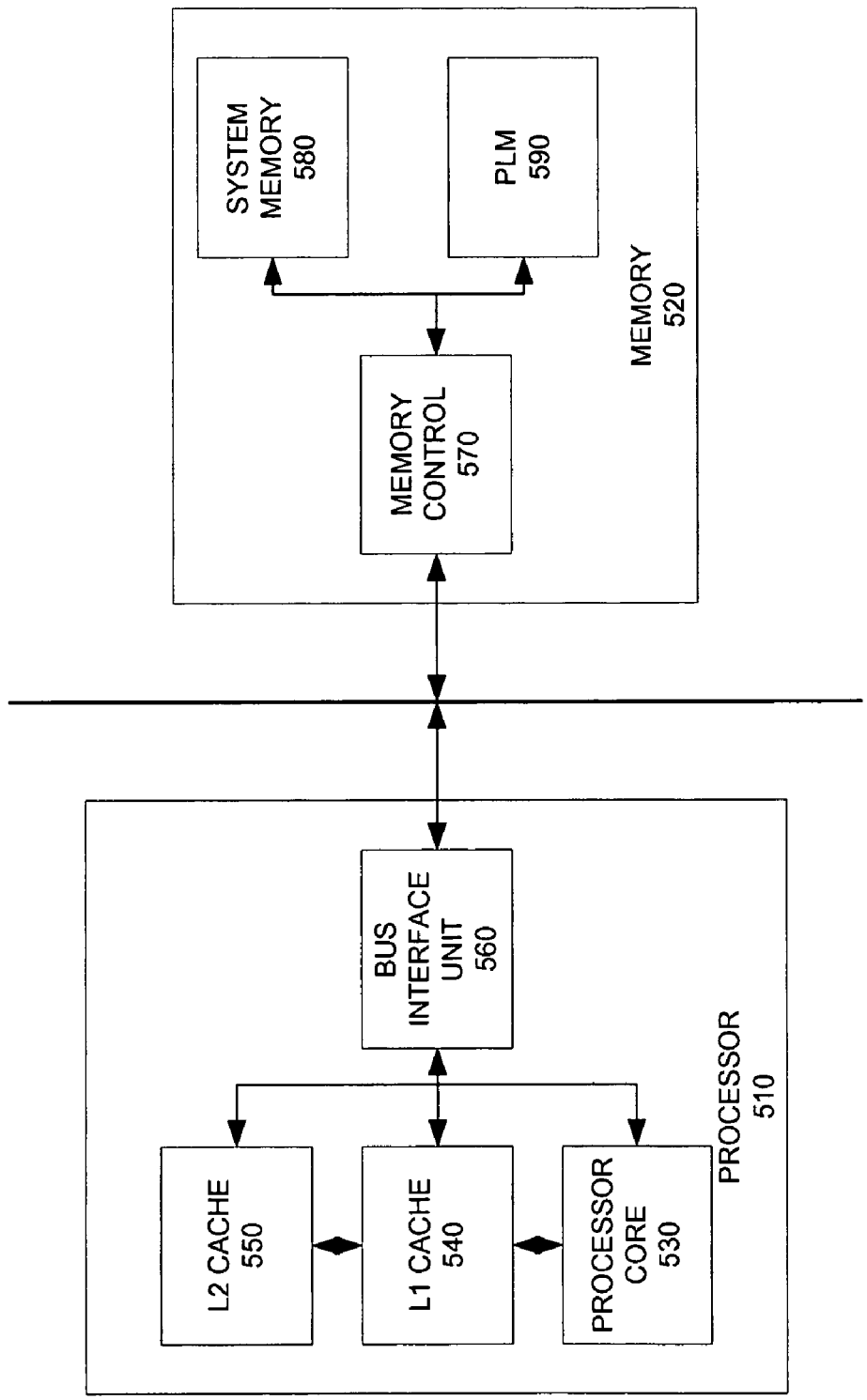
FIG. 5 is a block diagram illustrating an exemplary multiprocessor system suitable for use according to another embodiment of the present invention.

A PLM also may be provided as a counterpart to a system memory according to an embodiment of the present invention, shown in FIG. 5. FIG. 5 illustrates a system 500 that includes a plurality of agents 510, 520 coupled to a common communication bus. The agents may include microprocessors, digital signal processors, bridge interface chips, memory controllers and the like. Typically, the agents exchange data by initiating transactions on the communication bus. The transactions identify an action to be taken with respect to addressed data (e.g., a read or write), a memory location of the addressed data and a transfer of the data itself.

In the embodiment illustrated in FIG. 5, the PLM 590 may be provided coupled to a memory controller 570 in a manner that resembles system RAM 580 of modern computer systems. Thus, a processor 510 or other agent on the bus may initiate a transaction that identifies a PLM lookup for example, providing a search value as the address of the transaction and identifying a search range. Responsive to the transaction's type, the memory controller 570 may engage the PLM system 590 and pass the address to the PLM 590 as its search value. The PLM system 590 may perform the PLM lookup operation on the selected range and generate a response that identifies whether a hit occurred. If a hit was occurred, the PLM system 590 may output stored data that is associated with the search value. The memory controller 570 may respond to the posted transaction with a response that includes the output from the PLM 590.

The foregoing embodiments of the present invention advantageously provide a content addressable memory that can be managed and used directly by program instruction. As such, it can provide software designers a search capability that is not present in normal software design. For example, a PLM memory system can be used to replace entirely the operation of most hash lookup functions. Rather than design software that refers to a hash table and then iteratively steps through long linked list data structures to retrieve a pointer to a desired data record, the PLM system can retrieve the desired data structure in as little as a single processing step. A PLM memory that includes search values stored in CAM portions and the data record pointers in the associated storage portions will access the pointer to the desired data record directly with a single parallel lookup operation.

Several embodiments of the present invention are specifically illustrated and described herein. However, it will be appreciated that modifications and variations of the present invention are covered by the above teachings and within the purview of the appended claims, without departing from the spirit and intended scope of the invention.

I claim:

1. A parallel lookup memory, comprising:
   a content addressable memory (CAM) array, comprising:
      a plurality of CAM entries, each CAM entry comprising at least two storage locations, one of the locations including value matching logic, and
      a controller, responsive to an external command, to apply a search value to a sub-set of the CAM entries, the sub-set and search value being identified by the external command.

2. The parallel lookup memory of claim 1, wherein the external command includes data identifying CAM entries that are a start and end location of the sub-set.

3. The parallel lookup memory of claim 1, wherein the external command includes data identifying a CAM entries that is a start of the sub-set and a length identifier representing a number of CAM entries to be searched.

4. The parallel lookup memory of claim 1, further comprising:
   an allocation table having entries to store start and end identifiers of portions of the CAM array in use and to store a symbolic identifier of the respective portions, and
   wherein the external command identifies the sub-set by a corresponding symbolic identifier.

5. The parallel lookup memory of claim 1, provided in a processor core.

6. The parallel lookup memory of claim 1, provided in a processor chip external to a processor core as a counterpart to a layer of cache.

7. The parallel lookup memory of claim 1, provided in a computer system comprising a number of agents coupled to an external communication bus, wherein the parallel lookup memory is provided in a first agent and a processor is provided in a second agent.

8. A processor core, comprising
   a dispatcher to receive instructions and to assign the instructions to appropriate execution units; and the set of execution units including a parallel lookup memory, the parallel lookup memory comprising a content addressable memory (CAM) array to generate result data for storage in a destination register.

9. The processor core of claim 8, wherein the content addressable memory (CAM) array comprises a plurality of CAM entries, each CAM entry comprising at least two storage locations, one of the locations including value matching logic.

10. The processor core of claim 8, wherein the parallel lookup memory further comprises a controller, responsive to an external command, to apply a search value to a sub-set of the CAM entries, the sub-set and search value being identified by the external command.

11. The processor core of claim 10, wherein the external command includes data identifying CAM entries that are a start and end location of the sub-set.

12. The processor core of claim 10, wherein the external command includes data identifying a CAM entries that is a start of the sub-set and a length identifier representing a number of CAM entries to be searched.

13. The processor core of claim 10, wherein the parallel lookup memory further comprises:
an allocation table having entries to store start and end identifiers of portions of the CAM array in use and to store a symbolic identifier of the respective portions, and
wherein the external command identifies the sub-set by a corresponding symbolic identifier.

14. The processor core of claim 8, further comprising:
an instruction cache to receive the instruction;
an instruction decoder to decode the instruction received from the instruction cache;
a register file to store source data and results data for the instructions; and
an allocator to receive instruction from the instruction decoder and to allocate registers in the register file where data for the instructions may be stored, the allocator forwarding the instructions to the dispatcher.

15. A processor, comprising:
a processor core having an execution unit to execute instructions;
a cache hierarchy having various levels, comprising:
a parallel lookup memory (PLM) provided at the level of an L1 cache in communication with an execution unit the PLM having a plurality of content addressable memory (CAM) entries to store data,
where responsive to a PLM instruction received from the execution unit, the PLM determines if a match is found between a lookup value and data stored in the CAM entries.

16. The processor of claim 15, wherein the PLM comprises:
a content addressable memory (CAM) array, comprising:
a plurality of CAM entries, each CAM entry comprising at least two storage locations, one of the locations including value matching logic, and
a controller, responsive to an external command, to apply a search value to a sub-set of the CAM entries, the sub-set and search value being identified by the external command.

17. The processor core of claim 16, wherein the external command includes data identifying CAM entries that are a start and end location of the sub-set.

18. The processor core of claim 16, wherein the external command includes data identifying a CAM entries that is a start of the sub-set and a length identifier representing a number of CAM entries to be searched.

19. A multiprocessor computer system, comprising:
a plurality of agents coupled to a common communication bus, the plurality of agents having a processor to process data and a memory in communication with the processor to store data processed by the processor, the memory further comprising:
a memory controller to receive a search value; and
a parallel lookup memory (PLM) having a content addressable memory (CAM) array to perform a value matching between the search value and data stored in the CAM array.

20. The system of claim 19, wherein the CAM array comprises a plurality of CAM entries, each CAM entry comprising at least two storage locations, one of the locations including value matching logic.

21. The system of claim 19, wherein the PLM further includes a controller, responsive to an external command, to apply a search value to a sub-set of the CAM entries, the sub-set and search value being identified by the external command.

22. The processor core of claim 21, wherein the external command includes data identifying CAM entries that are a start and end location of the sub-set.

23. The processor core of claim 21, wherein the external command includes data identifying a CAM entries that is a start of the sub-set and a length identifier representing a number of CAM entries to be searched.

24. A processor comprising:
a processor core having an execution unit to execute instructions;
a look-up memory coupled to the execution unit,
wherein, responsive to an instruction having one or more operands defining a look-up range within the look-up memory, the look-up memory determines if a match is found between a look-up value and data stored in content addressable memory (CAM) entries.

25. The processor of claim 24, wherein said processor is to store a result data item in a destination location specified by an operand of said instruction.

26. The processor of claim 24, wherein said look-up memory is a context sensitive look-up memory.

27. The processor of claim 24, wherein said look-up memory is to compare an input identifier to a process identification associated with said look-up memory.

* * * * *